(12) United States Patent
Giraud et al.

(10) Patent No.: US 7,733,688 B2
(45) Date of Patent: Jun. 8, 2010

(54) ASYMMETRICAL SRAM CELL WITH 4 DOUBLE-GATE TRANSISTORS

(75) Inventors: Bastien Giraud, Sanary sur Mer (FR); Amara Amara, Sceaux (FR)

(73) Assignee: Commissariat a l'Energie Atomique, Paris (FR)

( * ) Notice: Subject to any disclaimer, the term of this patent is extended or adjusted under 35 U.S.C. 154(b) by 86 days.

(21) Appl. No.: 12/155,074

(22) Filed: May 29, 2008

(65) Prior Publication Data

US 2008/0298118 A1 Dec. 4, 2008

(30) Foreign Application Priority Data

Jun. 4, 2007 (FR) .................................. 07 03955

(51) Int. Cl.
*G11C 11/00* (2006.01)
(52) U.S. Cl. ...................................... 365/154; 365/156
(58) Field of Classification Search .................. 365/154, 365/156
See application file for complete search history.

(56) References Cited

U.S. PATENT DOCUMENTS

| | | | |
|---|---|---|---|
| 6,442,060 B1 | 8/2002 | Leung et al. | |
| 7,116,605 B2 | 10/2006 | Hong | |
| 7,313,012 B2* | 12/2007 | Chuang et al. | 365/154 |
| 7,498,637 B2* | 3/2009 | Yamaoka et al. | 257/351 |
| 2006/0274569 A1 | 12/2006 | Joshi et al. | |
| 2007/0211519 A1 | 9/2007 | Thomas et al. | |
| 2008/0175039 A1* | 7/2008 | Thomas et al. | 365/154 |
| 2009/0086528 A1* | 4/2009 | Hanafi | 365/156 |

FOREIGN PATENT DOCUMENTS

FR 2 898 432 9/2007

OTHER PUBLICATIONS

Noda et al., "A Loadless CMOS Four-Transistor SRAM Cell in a 0.18-μm Logic Technology," *IEEE Transactions on Electron Devices*, vol. 48, No. 12, Dec. 2001, pp. 2851-2855.
Kim et al., "Independent-Gate Controlled Asymmetrical SRAM Cells in Double-Gate MOSFET Technology for Improved Read Stability," *Proceedings of the 32$^{nd}$ European Solid State Conference ESSCIRC*, Sep. 2006.
Wang et al., "Single-Ended SRAM with High Test Coverage and Short Test Time," *IEEE Journal of Solid State Circuits*, vol. 35, No. 1, Jan. 2000, pp. 114-118.
Yamaoka et al., "Low Power SRAM Menu for SOC Application Using Yin-Yang-Feedback Memory Cell Technology," *Symp. VLSI Circuits Dig. 18*, 2004.

* cited by examiner

*Primary Examiner*—Hoai V Ho
*Assistant Examiner*—Kretelia Graham
(74) *Attorney, Agent, or Firm*—Oliff & Berridge PLC

(57) ABSTRACT

The random access memory cell of SRAM type comprises an access transistor provided with a gate electrode connected to a word line. The access transistor is connected between a bit line and a gate electrode of a first load transistor itself connected to a gate electrode of a driver transistor and to a first source/drain electrode of a second load transistor. The first load transistor and the driver transistor, in series, form an inverter at the supply voltage terminals. At least the transistors not comprised in the inverter comprise two electrically independent gate electrodes. The second gate electrode of the access transistor is connected to the first gate electrode of the second load transistor and the second gate electrode of the latter is connected to the supply voltage.

9 Claims, 3 Drawing Sheets

ASYMMETRICAL SRAM CELL WITH 4 DOUBLE-GATE TRANSISTORS

BACKGROUND OF THE INVENTION

The invention relates to a random access memory cell of SRAM type comprising an access transistor having a first gate electrode connected to a word line, a first source/drain electrode connected to a bit line, and a second source/drain electrode connected to a gate electrode of a first load transistor, to a gate electrode of a driver transistor and to a first source/drain electrode of a second load transistor, a second source/drain electrode of the second load transistor being connected to a supply voltage, the first load transistor and the driver transistor being connected in series to the terminals of the supply voltage.

STATE OF THE ART

Over the past few years, the electrical characteristics of transistors on bulk silicon substrate have worsened with the accentuation of parasitic effects related to the reduction of size. These modifications of the behaviour of the transistor have a great influence on the operation of memory cells and make their operation less rugged. At the same time, the conventional SRAM cell (Static Random Access Memory) comprising 6 transistors (4 NMOS and 2 PMOS), illustrated in FIG. 1, occupies too large a surface in integrated circuits. To reduce the size of these drawbacks, new architectures are seeing the light and should enable production of memory cells occupying a smaller surface, while at the same time having a rugged operation. In conventional manner, a memory cell with 6 transistors comprises two access transistors, $Ta_1$, $Ta_2$, having a source/drain electrode connected to a bit line BL or to a complementary bit line BLC and whose gate is connected to a word line WL. The cell also comprises two load transistors, $Tl_1$, $Tl_2$ each connected in series with a driver transistor $Td_1$, $Td_2$, between the terminals of a supply voltage Vdd to form two cross-coupled inverters. Another source/drain electrode of the access transistor is connected to one of the inverters at the level of the gate electrodes and to the other inverter at the level of the source and drain electrodes forming the common point of the corresponding load and driver transistors.

In a general manner, SRAM cells have to find the right trade-offs concerning dimensioning of the NMOS and PMOS transistors and their organization so as to:

minimize the surface of the memory cell,
  obtain rugged operating conditions in read and write,
  present a certain immunity to errors,
  present a cell write current compatible with the associated circuit,
  minimize the operating current,
  present a good ruggedness with respect to the fabrication process.

These general features mean that the electrical performances of the multiple transistors composing the memory cell play an extremely important role in the ruggedness of operation of the memory cell.

For a given technological node, the surface reduction of the cell is mainly linked to reduction of the number of transistors. However reorganization of the transistors always results in modification of its operation. Today, a large number of memory cells comprising only 4 or 5 transistors are proposed. These cells are generally connected to a word line and to two bit lines.

Certain architectures have led to loadless memory cells where the load transistors ($Tl_1$, $Tl_2$) have been eliminated (FIG. 2). In other cases it is the two driver transistors ($Td_1$, $Td_2$) that have been eliminated (FIG. 3) and a driverless memory cell is then obtained, as described in U.S. Pat. No. 6,442,060.

In general manner, memory cells with 4 transistors are not sufficiently stable to guarantee satisfactory operation taking account of the variations of the fabrication process. In particular, the loadless SRAM cell comprising 4 transistors is very sensitive to the shift of the electrical performances of the transistors of the cell and to temperature increase. These two points generally lead to additional compensation circuits being used and thereby greatly reduce the gain in surface obtained by eliminating transistors from the cell.

The use of an SRAM cell comprising one load transistor, two driver transistors and an access transistor has been proposed in U.S. Pat. No. 7,116,605. This approach enables the read and write operations to be performed simultaneously within the cell while minimizing its size. However to obtain such functionalities, this cell has to present, in addition to the 4 transistors described above, 2 write transistors and 3 command lines, a bit line, a word line and a common signal. This results in this cell, then comprising 6 transistors, occupying a large surface area in the integrated circuit.

Another path enabling the number of transistors and also the electric consumption to be reduced is the use of a single bit line. In this approach, illustrated by FIG. 4, a single access transistor Ta is then required. This memory cell differs from the memory cell according to FIG. 1 only by elimination of the second access transistor $Ta_2$.

However this approach with a single bit line is not commonly used, as problems of reliability of the read operation in the cell exist. This type of cell therefore does not present a sufficiently rugged operation.

As far as improving the ruggedness of operation of the memory cell without increasing the number of transistors in the cell is concerned, numerous publications describe the use of asymmetrical cells, i.e. cells where the electrical performances of groups of transistors are notably different. However, unlike symmetrical cells, asymmetrical memory dots have to be studied according to their stored state (high or low for each of the dots and with the possible combinations between these points).

Kim et al. ("Independent-Gate Controlled Asymmetrical SRAM Cells in Double-Gate Technology for Improved READ Stability", Proceedings of the 32nd European Solid State Conference ESSCIRC, September 2006) propose using an asymmetrical SRAM cell with 6 transistors. In this cell, the combination of the transistors of the left-hand part of the cell does not present the same electrical performances as the combination of the transistors of the right-hand part of the cell. The read phase is therefore-more rugged. Moreover, Kim et al. also describe the use of double-gate transistors with two electrically independent gates connected to different commands, for certain transistors. This approach enables the electrical characteristics of the transistors to be adjusted and operation of the cell to thereby be improved. However, the cell proposed by Kim et al. uses 6 transistors, which still represents a considerable surface on an integrated circuit.

Wang et al. ("Single-Ended SRAM with High Test Coverage and Short Test Time", IEEE Journal of Solid State Circuits, vol 35, N° 1 Jan. 2000) describe the use of an asymmetrical cell presenting a single access transistor. They also describe the use of different threshold voltages between the inverters to obtain a functional memory cell presenting a reduced electrical consumption. It is noteworthy that to be fully operational this memory cell does in fact have to comprise 6 transistors. The cell proposed therefore finally occupies substantially the same surface as a conventional memory cell.

OBJECT OF THE INVENTION

The object of the invention consists in remedying the above-mentioned shortcomings and in particular in providing a memory cell presenting rugged operating conditions and which occupies a surface compatible with industrial integration.

According to the invention, this object is achieved by the fact that the access transistor and the second load transistor each comprise at least one second gate electrode electrically independent from the corresponding first gate electrode, the second gate electrode of the access transistor being connected to the first gate electrode of the second load transistor and the second gate electrode of the second load transistor being connected to the supply voltage.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

Figure 1:
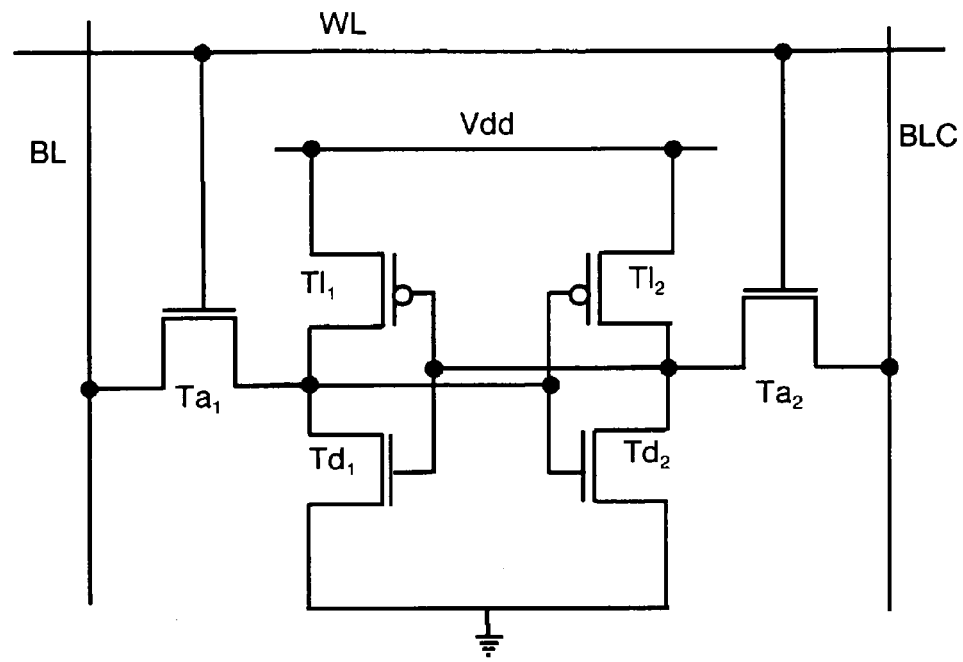
FIG. 1 represents an SRAM cell with 6 transistors according to the prior art.
Figure 2:
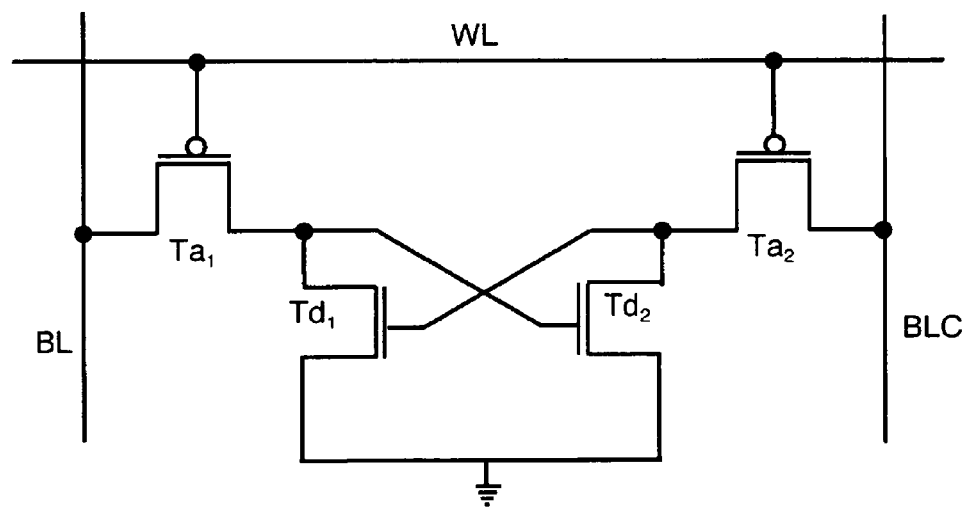
FIG. 2 represents a loadless SRAM cell with 4 transistors according to the prior art.
Figure 3:
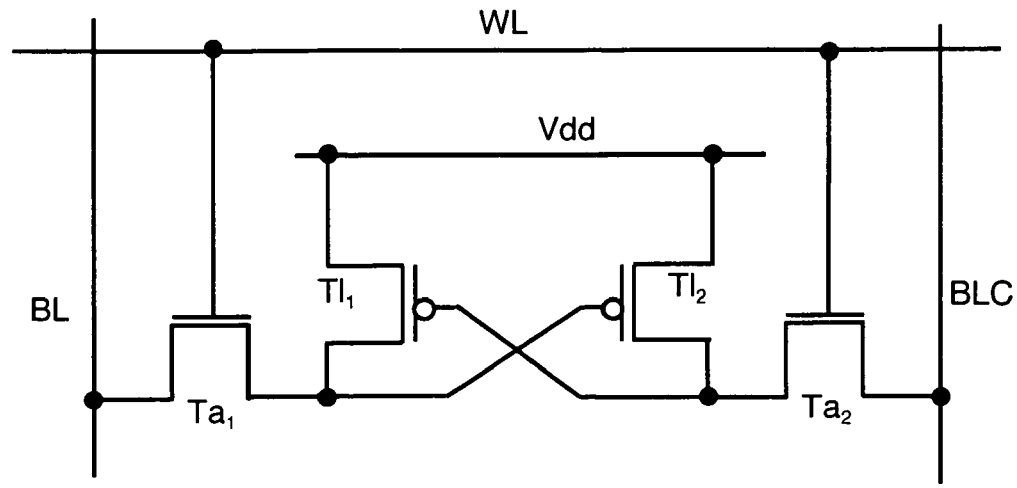
FIG. 3 represents a driverless SRAM cell with 4 transistors according to the prior art.
Figure 4:
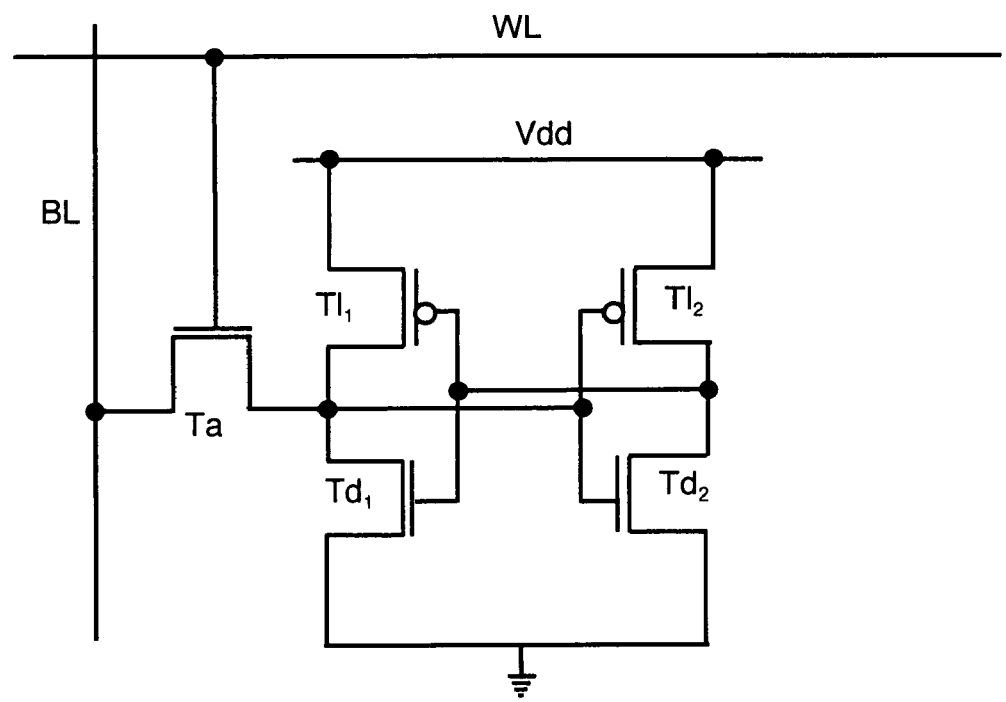
FIG. 4 represents a Single Ended SRAM cell with 5 transistors according to the prior art.
Figure 5:
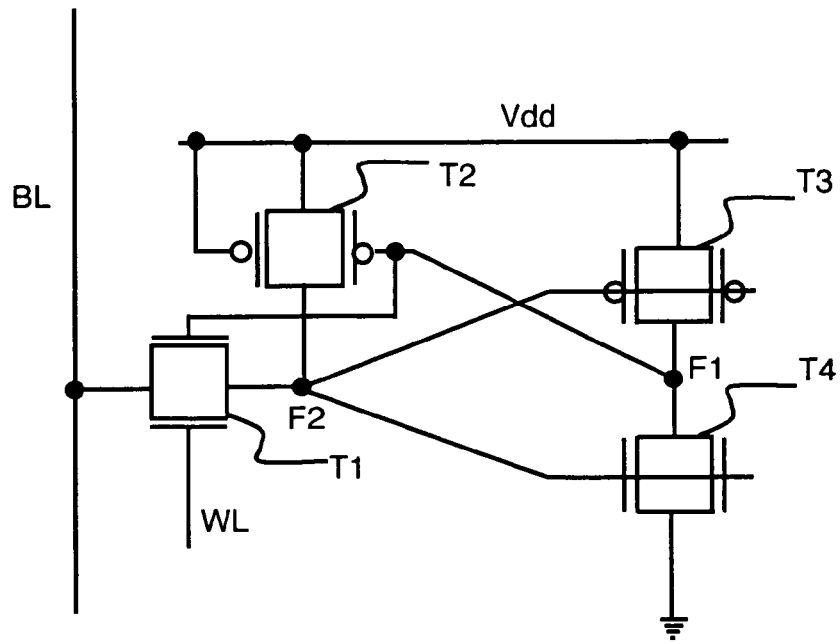
FIG. 5 represents a particular embodiment of an SRAM cell according to the invention.

The SRAM cell illustrated by FIG. 5 comprises 4 transistors. Load transistors T2, T3 are of opposite type to access transistor T1 and driver transistor T4. The memory cell comprises for example two NMOS transistors, i.e. access transistor T1 and driver transistor T4, and two PMOS transistors, i.e. the two load transistors T2 and T3.

The first load transistor T3 and driver transistor T4 are connected in series to the terminals of the supply voltage Vdd thus forming an inverter. In conventional manner, first load transistor T3 is connected to supply voltage and driver transistor T4 is grounded. The point common to the source/drain electrodes of load transistor T3 and driver transistor T4 forms an electric node F1.

The supply voltage has for example a rated voltage of 1.2V.

Access transistor T1 and second load transistor T2 comprise at least one additional gate electrode and are therefore at least double-gate transistors.

In FIG. 5, first access transistor T1 of NMOS double-gate type is connected by a first source/drain electrode to a bit line BL. Its second source/drain electrode is for its part connected to the gate electrodes of driver transistor T4 and first load transistor T3 and to a first source/drain electrode of second load transistor T2. These electrodes, connected to one another, define an electric node F2. The first gate electrode of access transistor T1 is connected to word line WL and its second gate electrode is at the same time connected to the first gate electrode of second load transistor T2 and to electric node F1.

Second load transistor T2 being connected by its first source/drain electrode to electric node F2, its second source/drain electrode is connected to supply voltage Vdd. Its first gate electrode being connected to electric node F1, its second gate electrode is also connected to supply voltage Vdd.

The use of double-gate transistors, i.e. with electrically independent first and second gate electrodes, enables the operating equations of the memory cell to be redefined with greater freedom and thereby enables a more advantageous trade-off to be obtained between ruggedness of operation and the surface occupied by the cell. However, the complexity of the cells obtained in this way requires numerous interdependent criteria to be analyzed for the best trade-off to be extracted.

Inside the memory cell, PMOS load transistors T2 and T3 have gates of length $L_P$ and width $W_P$ and NMOS access transistor T1 has gates of length $L_A$ and width $W_A$. As the dimensions of the transistors partially define their electric performances, a trade-off can be found between ruggedness of operation and the surface occupied by the memory cell by adjusting the dimensions of the transistors. Advantageously, with the transistor organization defined above, the transistor dimensions have to comply with the equation $$\frac{5W_P}{3L_P} \le \frac{W_A}{L_A}$$

to obtain the best trade-off between ruggedness of operation and the surface occupied by the memory cell.

Furthermore, to foster ruggedness of the operating conditions of the memory cell, access transistor T1 is preferably unbalanced. For example, the current/voltage characteristics of the latter are then redefined such that the current between the drain and source is greatly influenced by the voltage applied between the first gate and the source. Unbalance of this transistor can then be achieved by integrating gates with different characteristics while at the same time presenting gates of the same dimensions. This unbalance is achieved by any known means, for example by modifying the work functions of the gate materials and/or by modifying the thickness of the gate oxide from one gate to the other.

Advantageously, to obtain rugged operation of the memory cell, in access transistor T1, a high current ratio between source and drain, typically about 13 or more, is sought to be achieved, for a voltage between gate and source going from high state to low state on the second gate, the voltage on the first gate always being in high state.

It is noteworthy that the voltage applied to the second gate serves the purpose of increasing the stability significantly using the feedback mechanism. The feedback mechanism has already been used by Yamaoka et al. ("Low Power SRAM Menu for SOC Application using Yin-Yang Feedback Memory Cell Technology" Symp. VLSI Circuits Dig. 18, 2004).

Driver transistor T4 and first load transistor T3 can be conventional transistors with a single gate electrode each comprising a single gate. In a privileged embodiment, to simplify the fabrication process, all the transistors composing the memory cell are double-gate transistors. In this approach, the two gate electrodes of driver transistor T4 are preferably connected to one another. The same is the case for the two gate electrodes of first load transistor T3, as illustrated in FIG. 5.

For example purposes, the electrical characteristics of a double-gate technology cell of 32 nm type can be as follows:

| | |
|---|---|
| Supply voltage | 1.2 volt |
| Gate length (all transistors) | 50 nm |
| Work function, first gate of access transistor | 0.1 eV |
| Work function, second gate of access transistor | 0.3 eV |
| Work function, all gates of other transistors | −0.0872 eV |
| Gate oxide thickness of first gate of access transistor | 1 nm |
| Gate oxide thickness of second gate of access transistor | 4 nm |
| Gate width $W_P$ of PMOS transistors | 650 nm |
| Gate width $W_N$ of driver transistor | 350 nm |
| Gate width $W_A$ of access transistor | 500 nm |

For a 32 nm double-gate technology, the write time, about 330 ps in the least favorable case, is 1000 times shorter than the time representative of the write disturb under the same conditions. Likewise, the memory cell presents a very good trade-off between the retention and read mode stabilities (static noise margin). The memory cell in fact presents a read stability (about 492 mV) and retention stability (about 411 mV) at least 50 mV higher than equivalent memory cells for the same technology.

Furthermore, the memory cell presents a static current of about 1.49 nA, which places it in the mean of consumptions proposed by known memory cells with 6 or 4 transistors. However, the memory cell presents a write margin about twice lower than the memory cell comprising 6 transistors but remains in the same order of magnitude as other memory cells with 4 transistors (about 0.6V)

During a retention mode phase, word line WL can preferably be fixed at −Vdd/2 potential to reduce undesired write phenomena. Likewise, during a write phase, word line WL is preferably fixed at Vdd/2 potential to prevent data loss.

For example, by fixing the voltage of word line WL in retention mode at −0.6V, it has been observed that the memory cell still presents a very good trade-off between retention and read stabilities. However, the read stability (about 502 mV) has been improved to the detriment of the retention stability (about 258 mV). The mean static consumption has also been improved and is then about 1.22 nA. The write margin has not changed and the write time (about 261 ps in the least favorable case) is about 4500 times shorter than the time relative to the write disturb under the same conditions.

As a whole, the proposed cell has become more stable and its consumption has been reduced.

Figure 6:
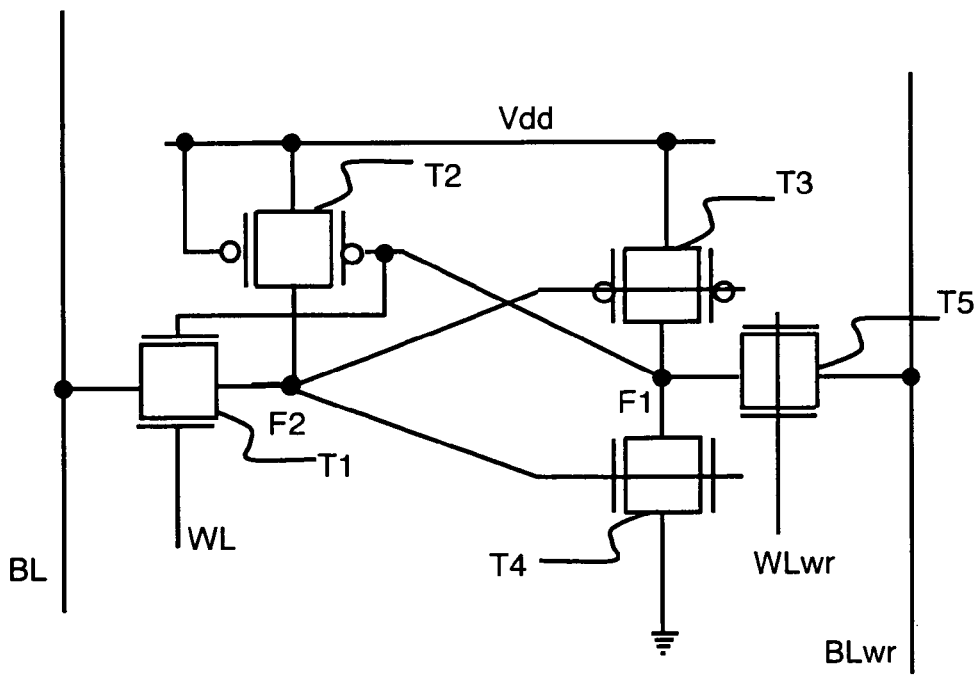
FIG. 6 represents an alternative embodiment of an SRAM cell according to the invention.

In an alternative embodiment illustrated by FIG. 6, an additional access transistor T5 is connected between node F1 and a write bit line by means of its source and drain electrodes. This additional access transistor T5 comprises at least one gate electrode. In the case of a double-gate transistor, the two gates are both connected to a write word line WLwr. Write bit line BLwr, write word line WLwr, and additional access transistor T5 are only used during the write phase. In this alternative embodiment, a differential write memory cell can be set up achieving a faster write phase and enabling the write margin to be reduced. In this configuration, the time relative to the write disturb phenomenon is kept. The write operation is performed by the two bit lines BL and BLwr and is then faster, whereas the read operation is still performed on a single bit line BL.

Advantageously, the dimensions of the different transistors of the cell can be modified depending on whether the cell comprises an additional access transistor T5 or not. As the memory cell has an operation that is modified by the addition of this additional transistor, a new trade-off can in fact be obtained by defining for example new $W_A/L_A$, $W_P/L_P$ and $W_N/L_N$ ratios. The characteristics of the memory cell are thereby greatly improved, the read and retention margins are higher, and the static consumption is lower. The write disturb over write time ratio has been multiplied by a factor four.

The invention claimed is:

1. A random access memory cell of SRAM type comprising an access transistor having a first gate electrode connected to a word line, a first source/drain electrode connected to a bit line, and a second source/drain electrode connected to a gate electrode of a first load transistor, to a gate electrode of a driver transistor and to a first source/drain electrode of a second load transistor, a second source/drain electrode of the second load transistor being connected to a supply voltage, the first load transistor and the driver transistor being connected in series to the terminals of the supply voltage, wherein the access transistor comprises at least one second gate electrode electrically independent from the first gate electrode, the second load transistor comprises at least one second gate electrode electrically independent from a first gate electrode of the second load transistor the second gate electrode of the access transistor being connected to the first gate electrode of the second load transistor and the second gate electrode of the second load transistor being connected to the supply voltage, and the access transistor has a current/voltage characteristic with a drain current depending more greatly on the voltage applied to its first gate than the current/voltage characteristics of the other transistors of the memory cell.

2. The memory cell according to claim 1, wherein the load transistors are of PMOS type.

3. The memory cell according to claim 1, wherein the access and driver transistors are of NMOS type.

4. The memory cell according to claim 1, wherein the driver transistor and the first load transistor each comprise an additional gate electrode.

5. The memory cell according to claim 4, wherein the two gate electrodes of the driver transistor are connected to one another.

6. The memory cell according to claim 4, wherein the two gate electrodes of the first load transistor are connected to one another.

7. The memory cell according to claim 1, wherein an additional access transistor, of the same type as the access and driver transistors, is connected between a point common to the first load transistor and the driver transistor and a write bit line and comprises a gate electrode connected to a write word line.

8. The memory cell according to claim 7, wherein the additional access transistor comprises an additional gate electrode.

9. The memory cell according to claim 8, wherein the two gate electrodes of the additional access transistor are connected to one another.

* * * * *